United States Patent [19]

Gifford

[11] Patent Number: 4,849,365
[45] Date of Patent: Jul. 18, 1989

[54] SELECTIVE INTEGRATED CIRCUIT INTERCONNECTION

[75] Inventor: David R. Gifford, San Antonio, Tex.

[73] Assignee: Honeywell Inc., Minneapolis, Minn.

[21] Appl. No.: 156,378

[22] Filed: Feb. 16, 1988

[51] Int. Cl.[4] .......................................... H01L 21/265
[52] U.S. Cl. ........................................ 437/31; 437/19; 437/173; 437/908; 437/922; 148/DIG. 10; 148/DIG. 55
[58] Field of Search .................... 437/19, 173, 174, 31, 437/32, 33, 145, 247, 908, 922, 921; 148/DIG. 10, DIG. 11, DIG. 55, DIG. 90, DIG. 93; 357/34

[56] References Cited

U.S. PATENT DOCUMENTS

| 3,641,516 | 2/1972 | Castrucci et al. | 340/173 |
|---|---|---|---|
| 3,725,148 | 4/1973 | Kendall | 437/19 |
| 3,733,690 | 5/1973 | Rizzi et al. | 29/577 |
| 3,781,825 | 12/1973 | Bürker et al. | 340/173 |
| 4,069,068 | 1/1978 | Beyer et al. | 148/1.5 |
| 4,172,741 | 10/1979 | Johnson | 437/19 |
| 4,203,781 | 9/1980 | Miller | 437/19 |
| 4,387,503 | 6/1983 | Aswell | 437/173 |
| 4,403,399 | 9/1983 | Taylor | 29/574 |
| 4,534,804 | 8/1985 | Cade | 148/1.5 |
| 4,598,462 | 7/1986 | Chandrasekhav | 437/922 |
| 4,624,046 | 11/1986 | Shideler | 437/922 |
| 4,635,345 | 1/1987 | Hankins | 437/922 |
| 4,651,408 | 3/1987 | MacElwee et al. | 29/576 |
| 4,651,409 | 3/1987 | Ellsworth | 437/922 |
| 4,665,295 | 5/1987 | McDavid | 219/121 |
| 4,674,176 | 6/1987 | Tuckerman | 29/591 |
| 4,783,424 | 11/1988 | Ohno | 437/174 |

FOREIGN PATENT DOCUMENTS 0142650 11/1981 Japan ...................................... 437/19

Primary Examiner—Brian E. Hearn
Assistant Examiner—Kevin McAndrews
Attorney, Agent, or Firm—W. T. Udseth

[57] ABSTRACT

A bipolar transistor with a laterally elongated emitter and base so a laser can diffuse dopant from that emitter through that base to the corresponding collector.

2 Claims, 1 Drawing Sheet

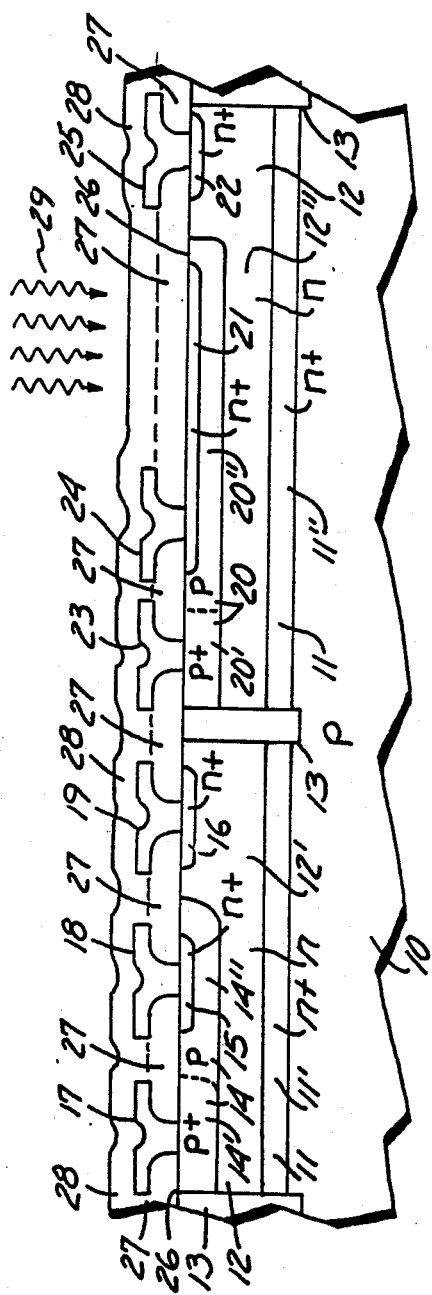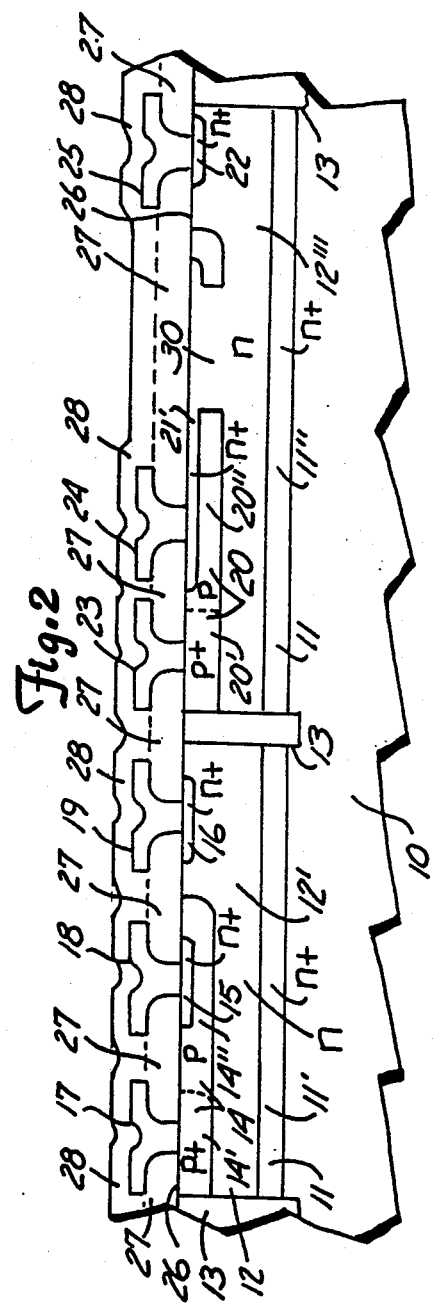

SELECTIVE INTEGRATED CIRCUIT INTERCONNECTION

BACKGROUND OF THE INVENTION

The present invention relates to monolithic integrated circuits and, more particularly, to monolithic integrated circuits which initially have pairs of regions isolated from one another which are to be selectively interconnected permanently.

A number of techniques have been resorted to to permit selective, permanent interconnections of circuit portions in monolithic integrated circuits after the fabrication process for such integrated circuits has been completed or nearly completed. A commonly encountered situation in which the option to permanently interconnect portions of a circuit, or to form a plurality of such interconnections for a plurality of circuits, is the selective interconnection of portions of read-only memories to thereby encode them. Another situation is to increase operable chip yield, and so reduce waste in the fabricating of monolithic integrated circuits through use of redundant circuit portions on the chips which are can be selectively interconnected in place of corresponding failed circuit portions. Yet another use is in the "trimming" of resistance values of integrated circuit resistors to leave them with a desired resistance value.

Among the techniques used to provide interconnection capabilities for such purposes is the use of doped polycrystalline silicon links or conductive metal links between two regions which can be selectively removed through irradiating them with a laser beam having sufficient energy to vaporize portions of such links. However, the vaporizing of these links by the laser can lead to damage of the materials underlying these links. Further, if the links are irradiated before a passivation or other protective layer is provided over them, this irradiation to remove the links can lead to the ejecting of link materials from the link to the surrounding regions which allows the possibility of adverse effects in those regions by such debris. On the other hand, irradiating the links after they have been covered by a protective layer can lead to large vapor pressures under the passivation layer which may result in a cracked or otherwise damaged passivation layer.

Other techniques have required special structures or additional structural features differing from those found in typical integrated circuit structures requiring extra fabrication steps and so increased costs. Some of the structures used as links require substantial currents to flow to sufficiently damage these links so as to cause them to melt or vaporize, again leading to debris and substantial heating which can adversely affect the monolithic integrated circuit.

Thus, there is desire to find a way of providing an option for selectively permanently interconnecting regions in a monolithic integrated circuit which can be provided through the same fabrication steps used in fabricating the remaining portions of the integrated circuit. Such an interconnection option must provide a reliable interconnection without collateral damage to other structural features.

SUMMARY OF THE INVENTION

The present invention provides a bipolar transistor in a monolithic integrated circuit chip, made commonly with other bipolar transistors therein, which has laterally elongated emitter and base regions such that room is provided for a laser to diffuse dopant from the elongated emitter region through the elongated base region into the corresponding collector region.

BRIEF DESCRIPTION OF THE DRAWINGS

FIG. 1 shows an embodiment of the present invention in an unconnected state, and FIG. 2 shows an embodiment of the present invention after interconnection has been made.

DETAILED DESCRIPTION OF THE PREFERRED EMBODIMENTS

FIG. 1 shows a portion of a monolithic integrated circuit formed in a semiconductor material body having a silicon, primarily p-type conductivity, substrate, 10. An exception to this conductivity type in substrate 10 are $n^+$-type conductivity buried layer regions, 11, formed at the upper surface therein, and underlying an n-type conductivity, silicon epitaxial layer, 12. Buried layer region 11 and epitaxial layer 12 have each been separated into a number of portions electrically isolated from one another by trench isolation regions, 13. Trench isolation regions 13 are formed by first providing a more or less rectangular groove or trench below the upper surface of epitaxial layer 12. These grooves are then filled by growing and depositing an oxide of silicon to form trench isolation regions 13.

Trench isolation regions 13 separate two portions of buried layer 11 and epitaxial layer 12 in FIG. 1 to permit forming two electrically isolated bipolar transistors, one in each such separated portion. The first of these buried layer 11 portions, 11', is shown to the left of the central trench isolation region 13 in FIG. 1, and the second, 11", is shown on the right. Similarly, the first of the epitaxial layer 12 portions, 12', is shown to the left of the central trench isolating region 13 in FIG. 1, and the remaining portion, 12", is shown on the right. Buried layer portion 11' and epitaxial layer portion 12' are part of the collector region for the bipolar transistor formed to the left of the central trench isolation region 13 in FIG. 1, and buried layer portion 11" and epitaxial layer portion 12" are part of the collector region for the second bipolar transistor formed on the right in FIG. 1.

In epitaxial layer portion 12' on the left in FIG. 1, there is formed a base region, 14, in two parts, an inactive base region, 14', of $p^+$-type conductivity and an active base region, 14", of a p-type conductivity. An emitter region, 15, of $n^+$-type conductivity is shown formed in active base region 14" in the transistor on the left. A collector contact region, 16, for this transistor is shown formed in epitaxial layer portion 12' in this left side transistor in FIG. 1, this contact region being of $n^+$-type conductivity.

The left side bipolar transistor in FIG. 1 has a base contact, 17, from part of the integrated circuit interconnection system in ohmic contact with inactive base region 14'. An emitter contact, 18, is provided from part of the integrated circuit interconnection system to emitter 15. Finally, a collector contact, 19, again from part of the integrated circuit interconnection system, is provided in ohmic contact with collector contact region 16. Each of these contacts can be formed of a suitable metal, typically an aluminum alloy.

The right side transistor in FIG. 1 has a base region, 20, formed of an active base region portion, 20', of $p^+$-type conductivity, and an inactive base region portion, 20", formed of a p-type conductivity region. This right side transistor has its emitter, 21, formed of an n+-type conductivity region formed in active base region 20". A collector contact, 22, for this transistor is formed also of an n+-type conductivity region in epitaxial layer portion 12".

A base contact, 23, for the right side transistor in FIG. 1, from part of the integrated circuit interconnection network, is in ohmic contact with inactive base region 20'. Similarly, an emitter contact, 24, for this transistor from a part of the integrated circuit interconnection network is in ohmic contact with emitter region 21. Finally, a collector contact, 25, for this right side transistor from part of the integrated circuit interconnection network is in ohmic contact with collector contact region 22. Again, these interconnection network contacts can be formed of an aluminum alloy.

The resistivity of substrate 10 is about 9 to 13 Ω-cm due to boron doping of the silicon material. The formation of buried layer 11 is accomplished by the ion implantation of arsenic ions with a dose of $1 \times 10^{15}$ ion/cm$^2$ at an implantation energy of 60 Kev to provide a layer that is about 1.0 μm thick followed by a thermal diffusion to provide a layer that is around 3.0 μm thick. Epitaxial layer 12 is doped with phosphorus to provide a resistivity of 0.3Ω-cm, and is deposited in an epitaxial process to a depth of 1.0 μm. The inactive base regions 14' and 20' are each formed by ion implantation of boron ions with a dose of $1 \times 10^{15}$ ion/cm$^2$ and an implantation energy of 20 Kev to yield a junction depth for each of them of about 0.66 μm from the earlier mentioned upper surface of epitaxial layer 12 which is the upper semiconductor material major surface, 26. The active base regions of the two transistors, 14" and 20", are formed by two successive ion implantations, also of boron ions, the first with a dose of $2.7 \times 10^{13}$ ion/cm$^2$ at an energy of 20 Kev and the second with a dose of $1.1 \times 10^{13}$ at 80 Kev to thereby provide a junction depth of about 0.58 μm. Emitter regions 15 and 21 of the two transistors, and the collector contact regions 16 and 22 of each of them, are formed by ion implantation of arsenic in a dose of $6 \times 10^{15}$ ion/cm$^2$ at an energy of 30 Kev to provide junction depths of about 0.28 μm below major surface 26 for each of them.

A surface layer, 27, primarily of silicon dioxide, is provided and remains on surface 26 and over trench isolation regions 13 as a result of fabricating these transistors, which also supports in part the interconnection network contacts shown but which also opens so these contacts can reach surface 26. A final protective layer, 28, is provided over this surface oxide layer and the interconnection network with its various associated contacts. Protective layer 28 is formed of deposited silicon dioxide doped with phosphorus and boron in a 6 to 7% concentration of dopants to provide a boro-phospho-silicate glass (BPSG). Layers 27 and 28 jointly have a thickness of approximately 0.6 μm over emitter 21 of the right side transistor in FIG. 1.

In some situations, more than one level of interconnection network may be used with each such level separated from the one below by an intervening electrical insulator layer except where opened to permit interconnections between levels of the interconnection network system. Thus, more than two layers of silicon oxides may be present over emitter 21.

The left side transistor in FIG. 1 is an ordinary signal or switching transistor. The right side transistor is formed with the same set of fabrication steps as is this left side transistor. The right side transistor, as a result, has the same vertical structural arrangement as does the left side transistor. Thus, these two transistors would be identical except for the elongated active base region 20" and the elongated emitter region 21, both of these being elongated laterally parallel to surface 26. These elongated structures result in an irradiation location at surface 26 which allows using the right side transistor of FIG. 1 as a permanent interconnection means between two portions of the interconnection system in the integrated circuit.

The two interconnection portions which could be connected would be that portion of the interconnection network of which emitter contact 24 is a part, and that portion of which collector contact 25 is a part. In FIG. 1, the integrated circuit structure portions to be shown as interconnected would be emitter region 21 and the collector region of the right side transistor formed by buried layer portion 11", epitaxial layer portion 12" and collector contact portion 22.

The structure shown in FIG. 1 is the structure that results when there is an electrical path between terminal 24 and terminal 25 of a very low conductivity. The structure shown in FIG. 2 is the result of providing a path of a very much greater conductivity between these terminals, that is between emitter region 21 and the collector region of the right side transistor. This high conductivity path is provided by irradiating the irradiation location in surface 26 above emitter 21 sufficiently to cause the arsenic dopant in emitter 21 to diffuse through active base region 20" into epitaxial layer portion 12".

Such a diffusion can be accomplished by directing the electromagnetic radiation beam from a Nd:YAG laser onto surface 26 at the irradiation location above emitter 21, this being having a wavelength of 1.06 μm (infrared portion of spectrum). This is a wavelength at which layers 28 and 27 are substantially transparent, but at which the doped silicon material near surface 26 in emitter 21 is substantially absorptive to thereby cause local heating. Such a laser is found to be satisfactory if providing a total output energy for a diffusion of 1.0 to 5.0 μJ (micro Joules) and a spot size of about 6.0 μm. The radiation from such a laser, 29, is shown provided to the structure in FIG. 1 so the resulting diffusion of the arsenic in emitter 21 gives the result shown in FIG. 2. The relatively high conductivity path established by this irradiation is designated 30 in FIG. 2. This diffusion modification affects emitter region 21 and epitaxial layer 12" in FIG. 1, and so these have been redesignated in FIG. 2 as emitter region 21'and epitaxial layer 12'''.

The use of laser radiation to provide relatively high conductivity path 30 by diffusion eliminates the creation of significant vapor pressures under layers 27 and 28, as would occur if materials were being vaporized thereunder for removal. As a result, pressures are avoided at surface 26 which could lead to the cracking of layers 27 and 28 thereby damaging their ability to keep out contaminants, or lead to other damage.

Although the present invention has been described with reference to preferred embodiments, workers skilled in the art will recognize that changes may be made in form and detail without departing from the spirit and scope of the invention.

What is claimed is:

1. A method for providing a permanent relatively high conductivity electric current flow path between two regions of semiconductor material which are initially electrically isolated from one another, said method comprising:

forming a plurality of bipolar transistors each in a collector region of a first conductivity type in a semiconductor material body at a major surface thereof through forming in each said collector region a corresponding base region of a second conductivity type each with a corresponding emitter region therein intersecting said major surface, each said emitter region being of said first conductivity type due to a first dopant being distributed therein, one of said plurality of said bipolar transistors having an elongated emitter region with an ohmic contact made thereto at said major surface by an interconnection means, said elongated emitter region and its said corresponding base region extending in a direction substantially parallel to said major surface asymmetrically with respect to said ohmic contact; and irradiating said elongated emitter region at an irradiation location in said major surface with a laser beam sufficiently to diffuse said first dopant through its corresponding said base region to reach its corresponding said collector region whereby a relatively high conductivity path is formed between said elongated emitter region and its corresponding said collector region.

2. The method of claim 1 wherein said elongated emitter region extends in a direction substantially parallel to said major surface sufficiently to provide said irradiation location.

* * * * *

UNITED STATES PATENT AND TRADEMARK OFFICE
CERTIFICATE OF CORRECTION

PATENT NO. : 4,849,365

DATED : July 18, 1989

INVENTOR(S) : David R. Gifford

It is certified that error appears in the above-identified patent and that said Letters Patent is hereby corrected as shown below:

Column 1, after the title, insert --The Government has rights in this invention pursuant to Contract No. F33615-84-C-1500, awarded by the Department of the Air Force.--

Signed and Sealed this

Twelfth Day of November, 1991

Attest:

HARRY F. MANBECK, JR.

*Attesting Officer*  *Commissioner of Patents and Trademarks*